United States Patent [19]

Urano et al.

[11] Patent Number: 6,121,097
[45] Date of Patent: Sep. 19, 2000

[54] SEMICONDUCTOR DEVICE MANUFACTURING METHOD

[75] Inventors: Yuichi Urano; Masato Nishizawa; Yoshiyuki Sakai; Naoki Ito; Shinichi Hashimoto, all of Nagano, Japan

[73] Assignee: Fuji Electric Co., Ltd., Japan

[21] Appl. No.: 09/072,903

[22] Filed: May 5, 1998

Related U.S. Application Data

[62] Division of application No. 08/769,031, Dec. 17, 1996, Pat. No. 5,854,120.

[30] Foreign Application Priority Data

Dec. 18, 1995 [JP] Japan .................................. 7-328461

[51] Int. Cl.[7] .......................... H01L 21/336; H01L 21/76
[52] U.S. Cl. .......................... 438/294; 438/403; 438/431; 438/433; 438/446; 438/447
[58] Field of Search ...................................... 438/294, 403, 438/431, 433, 446, 447

[56] References Cited

U.S. PATENT DOCUMENTS

| 5,196,373 | 3/1993 | Beasom . |
| 5,318,663 | 6/1994 | Buti et al. . |
| 5,496,765 | 3/1996 | Schwalke . |
| 5,700,712 | 12/1997 | Schwalke . |

*Primary Examiner*—John F. Niebling
*Assistant Examiner*—Josetta I. Jones
*Attorney, Agent, or Firm*—Morrison Law Firm

[57] ABSTRACT

A polysilicon film is deposited in a trench formed in a silicon element substrate. The polysilicon film in the trench and on the silicon element substrate is anisotropically etched, so that the film remains on the side wall of the trench. The polysilicon film on the side wall is oxidized to obtain an insulating film, which buries the trench. At the same time, an oxidized film is formed on the surface of the silicon element substrate to complete a trench-mold separation area.

2 Claims, 6 Drawing Sheets

SEMICONDUCTOR DEVICE MANUFACTURING METHOD

This application is a Division of Ser. No. 08/769,031 filed Dec. 17, 1996, U.S. Pat. No. 5,854,120.

BACKGROUND OF THE INVENTION

The present invention relates to a semiconductor device manufacturing method. In particular, the present invention relates to a method for forming an element-separation area on an SOI ("Silicon On Insulator") wafer.

Conventional methods for separating elements in semiconductor integrated circuits include the LOCOS ("Local Oxidation of Silicon") method, which uses thick oxidized films. In recent years, however, trench-mold separation methods have frequently been used to separate semiconductor elements in an SOI wafer. An SOI wafer comprises a support substrate and a silicon element substrate, attached together via an insulating film (hence "silicon on insulator"). In a conventional trench-mold separation method, a trench is formed that extends from the surface of the silicon element substrate down to the insulating film. Then an insulating film or, alternatively, both an insulating film and a polycrystal silicon film are buried in the trench. These trench-mold separation methods are suitable for use with high voltage-resistant elements, because the potentials of the elements can be perfectly isolated.

FIGS. 6(a) to 6(e) are cross-sectional views showing the manufacture of a semiconductor by a conventional trench-mold separation method. An SOI wafer comprises a silicon element substrate 3 adhering to a supporting substrate 1 via a separating insulating film 2. An oxidized film 4 is formed on the surface of silicon element substrate 2 [FIG. 6(a)]. Patterning and etching are then performed, using a photo-etching technique. Silicon element substrate 3 is etched down to separating insulating film 2, using patterned oxidized insulating film 4 as a mask, to form a trench 8 [FIG. 6(b)].

After removing the photo resist and oxidized insulating film 4 from silicon element substrate 3, an oxidized film 9 is formed on the surface of silicon element substrate 3 and on the side wall of trench 8 by thermal oxidation [FIG. 6(c)]. The thickness of oxidized film 9 is generally about 0.5–1.0 $\mu$m. Low-pressure chemical vapor deposition (hereinafter "CVD") is subsequently used to deposit 2 $\mu$m of a polysilicon film 5A on semiconductor element substrate 3 and in trench 8 [FIG. 6(d)]. Etchback is then performed to remove polysilicon film 5A from silicon element substrate 3 and the upper part of trench 8 while leaving the remainder of polysilicon film 5A in trench 8 [FIG. 6(e)].

The conventional trench-mold method employs thermal oxidization to form oxidized film 9. Since oxidized film 9 is used for insulation, it must have a thickness of at least about 0.5 $\mu$m in order to obtain a high-voltage-resistant element. To obtain a film of the desired thickness, thermal oxidization must be executed at high temperatures over long periods of time. As a result, stress concentration may occur in corners 10, 11 of trench 8 and lead to deformation and degradation of crystals in corners 10, 11. This stress concentration probably is due to the difference in the thermal expansion coefficients of silicon element substrate 3 and oxidized film 9. As a result, the breakdown voltage of a semiconductor device formed on silicon element substrate 3 is weakened, and current leaks are more likely to occur.

To prevent these undesirable side effects, a semiconductor element may be separated from trench 8 and corners 10, 11 of the trench rounded off, as described in Japanese Laid Open Patent Application No. 129854/1991. However, if the semiconductor element is separated from trench 8, the size of the chip must be increased. In addition, although it is technically possible to round off corners 10, 11 of trench 8, uniformly etching the top and bottom of trench 8 becomes more and more difficult as the depth of trench 8 increases, and the probability of non-uniform roundness may increase. As a result, the breakdown voltage of the semiconductor devices may decrease, and current leaks therefrom will be nonuniform.

OBJECTS AND SUMMARY OF THE INVENTION

Accordingly, it is an objective of the present invention to provide a method for manufacturing a trench-mold separation layer that overcomes the limitations of the prior art.

It is another objective of the present invention to provide a method for manufacturing a trench-mold separation layer that prevents degradation of crystals in the silicon element substrate.

It is a further objective of the present invention to provide a method for manufacturing a trench-mold separation layer that minimizes reduction of breakdown voltage and current leaks.

It is a further objective of the present invention to provide a method for manufacturing a trench-mold separation layer that avoids increasing the size of the chip.

Briefly stated, a polysilicon film is deposited in a trench formed in a silicon element substrate. The polysilicon film in the trench and on the silicon element substrate is anisotropically etched, so that the film remains on the side wall of the trench. The polysilicon film on the side wall is oxidized to obtain an insulating film, which buries the trench. At the same time, an oxidized film is formed on the surface of the silicon element substrate to complete a trench-mold separation area.

According to an embodiment of the present invention, there is disclosed a semiconductor device manufacturing method, comprising the steps of forming a trench in an SOI substrate, wherein the SOI substrate includes a support substrate, the silicon element substrate, and a separating insulating film between the silicon element substrate and the support substrate, and wherein the trench has a bottom formed by a portion of a separating insulating film, and at least one side wall formed by at least one portion of the silicon element substrate; depositing a first polysilicon film in the trench; and oxidizing the first polysilicon film, such that the trench is filled with an oxidized silicon material.

According to another embodiment of the present invention, there is disclosed a semiconductor device manufacturing method, comprising the steps of forming a first insulating film on a silicon element substrate in an SOI substrate by thermal oxidation of the silicon element substrate, wherein the SOI substrate includes a support substrate, the silicon element substrate, and a separating insulating film between the silicon element substrate and the support substrate; etching the silicon element substrate to form a trench, the trench having a bottom formed by a portion of the separating insulating film, and at least one side wall formed by at least one portion of the silicon element substrate; depositing a first polysilicon film upon a surface of the bottom, a surface of each of the at least one side wall of the trench, and the first insulating film; etching the first polysilicon film on the first insulating film and on the bottom of the trench, using an anisotropic etching technique, to expose the first insulating film and a portion of the bottom, and to leave a portion of the first polysilicon film on the at least one side wall of the trench; etching and removing the exposed first insulating film; and oxidizing the portion of the first polysilicon film remaining on the silicon element substrate and the at least one side wall of the trench, to allow growth of a second insulating film isolating the silicon element substrate.

According to another embodiment of the present invention, there is disclosed a semiconductor device manufacturing method, comprising the steps of forming a first insulating film on a silicon element substrate in an SOI substrate by thermal oxidation of the silicon element substrate, wherein the SOI substrate includes a support substrate, the silicon element substrate, and a separating insulating film between the silicon element substrate and the support substrate; etching the silicon element substrate to form a trench, the trench having a bottom formed by a portion of the separating insulating film, and at least one side wall formed by at least one portion of the silicon element substrate; depositing a first polysilicon film upon a surface of the bottom, a surface of each of the at least one side wall of the trench, and the first insulating film; etching the first polysilicon film on the first insulating film and on the bottom of the trench, using an anisotropic etching technique, to expose the first insulating film and a portion of the bottom, and to leave a portion of the polysilicon film on the at least one side wall of the trench; etching and removing the exposed first insulating film; and depositing an oxidized insulating film on the silicon element substrate and in the trench, using chemical vapor deposition, to isolate the silicon element substrate.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1A:
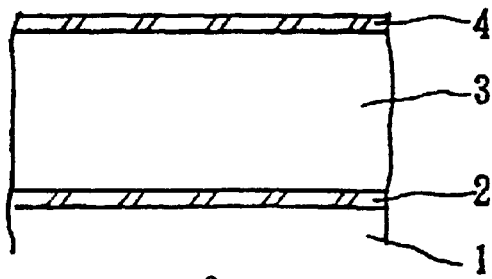
FIG. 1(a) is a cross-sectional view of the formation of a first oxidized insulating film on a silicon element substrate according to the first and second embodiments of the invention.

A semiconductor device is manufactured according to the method of this invention by forming a first oxidized insulating film on a silicon element substrate in an SOI substrate comprising a support substrate, a separating insulating film, and a silicon element substrate. The first oxidized insulating film then is patterned to form a mask having an opening, and the silicon element substrate is etched to form a trench that reaches the separating insulating film. A polysilicon film is deposited to cover the first oxidized insulating film and the inner surface of the trench.

Next, the polysilicon film on the first oxidized insulating film and in the trench is etched, using an anisotropic etching technique, to expose the first oxidized insulating film and the bottom of the trench, while leaving the polysilicon film on the side wall of the trench. The first oxidized insulating film is then etched and removed. The polysilicon film remaining on the side walls of the trench, as well as the silicon element substrate, is thermally oxidized to allow the growth of a second oxidized insulating film that contacts the separating insulating film. The growth of the second oxidized insulating film buries the trench and thereby isolates the silicon element substrate.

This method reduces the required oxidization temperature and time, because polysilicon substrates are thermally oxidized faster than monocrystal silicon substrates. The reduced oxidation temperature and time lowers the stress on the crystals in the corners of the silicon element substrate, and results in decreased degradation of those crystals. The polysilicon film remaining on the side walls of the trench also acts as a stress-relieving material between the oxidized film and the silicon element substrate during the final thermal oxidization step.

Alternatively, after the trench-forming step, a first thin polysilicon film may be deposited and oxidized to cover the side wall of the trench, followed by deposition of a second polysilicon film. The first polysilicon film on the side wall acts as a stress relieving material during the oxidization of the second polysilicon film. The first polysilicon film also prevents impurities from diffusing from the second polysilicon film into the silicon element substrate.

Alternatively, the polysilicon film on the side wall of the trench may be incompletely oxidized. This allows the polysilicon film to have effects similar to those of the above first polysilicon film, while requiring fewer steps.

Alternatively, rather than oxidizing the polysilicon film remaining on the side wall to form an insulating film in the trench, CVD may be performed to form the second insulating film. Forming the insulating film by CVD further alleviates stresses on the side walls during burial of the trench, because it requires lower temperatures than thermal oxidization.

In any of the above embodiments, the polysilicon film may be doped with impurities. This allows the polysilicon remaining on the side wall to alleviate stress during oxidization, and also allows the dopant to diffuse into a diffusion area within the silicon substrate.

First Embodiment

Figure 1B:
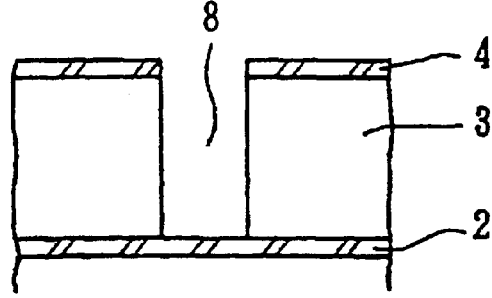
FIG. 1(b) is a cross-sectional view of the formation of an element-separating trench according to the first and second embodiments of the invention.

An SOI wafer has, as a semiconductor-device forming area, a silicon element substrate 3 formed on a separating insulating film 2. Insulating film 2 is formed on a support substrate 1. Thermal oxidization is performed to form a first oxidized insulating film 4 [FIG. 1(a)]. First oxidized insulating film 4 is etched by photo-etching-based patterning and etching to produce an oxidized film mask. Anisotropic etching is then performed by any convenient means, such as magnetron reaction ion etching (RIE) using hydrogen bromide (HBr) as the etching gas, to anisotropically etch silicon element substrate 3 and form an element-separating trench 8 that reaches separating insulating film 2 [FIG. 1(b)].

Figure 1C:
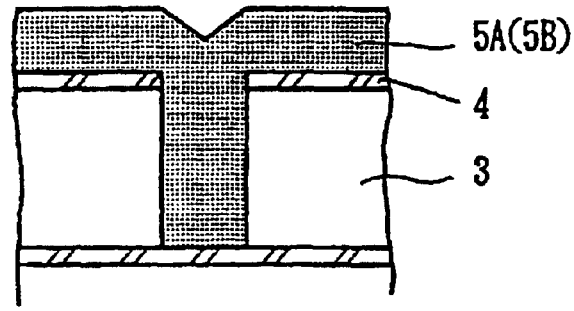
FIG. 1(c) is a cross-sectional view of the formation of a polysilicon film on the surface of a silicon element substrate and in an element-separating trench according to the first and second embodiments of the invention.
Figure 1D:
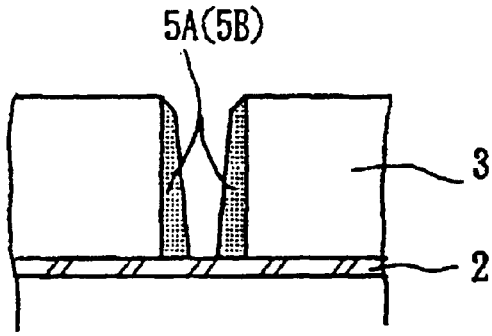
FIG. 1(d) is a cross-sectional view of the polysilicon film left on the side walls of a trench after anisotropic etching according to the first and second embodiments of the invention.
Figure 1E:
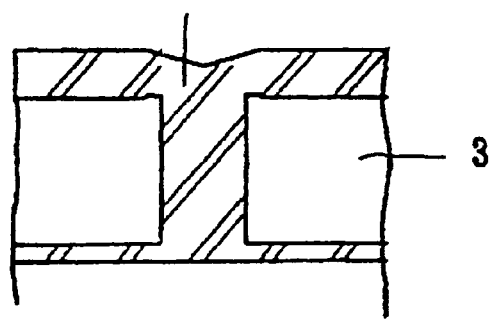
FIG. 1(e) is a cross-sectional view of the formation of a second oxidized film that buries a trench according to the first and second embodiments of the invention.

Next, low-pressure CVD is performed, for example using a monosilane gas at a reaction temperature of about 600° C., to form a pure polysilicon film 5A that covers the surface of silicon element substrate 3 and fills trench 8 [FIG. 1(c)]. Anisotropic etching is again used to etch polysilicon film 5A on the surface of silicon element substrate 3 and in trench 8. Polysilicon film 5A is etched in such a way that polysilicon film 5A remains on the side wall of trench 8 and separating insulating film 2 is exposed at the bottom of trench 8. Polysilicon film 5A may be anisotropically etched by any convenient means, such as electron cyclotron resonance (ECR) plasma etching using HBr or chlorine ($Cl_2$). A fluorine solution is then used to remove first oxidized insulating film 4 from the surface of silicon element substrate 3 [FIG. 1(d)]. Finally, polysilicon film 5A remaining on the side wall of trench 8 is thermally oxidized to fill trench 8 and form a second oxidized film 6A on the surface of silicon element substrate 3 [FIG. 1(e)].

By oxidizing polysilicon film 5A left on the side wall of trench 8 to form second oxidized film 6A, the oxidization temperature and time are reduced, because the polycrystal silicon of polysilicon film 5A is thermally oxidized faster than the monocrystal silicon of silicon element substrate 3. In addition, since polysilicon film 5A left on the side walls of trench 8 serves to relieve the stress between second oxidized film 6A and silicon element substrate 3, degradation of crystals in corners of silicon element substrate 3 is less likely to occur. Therefore, reduction of the breakdown voltage of the semiconductor element formed within silicon element substrate 3 is prevented, and current leaks are less likely to occur.

The breakdown voltage of the semiconductor device produced according to the method of Embodiment 1 is about 15% higher than devices produced by conventional methods.

Second Embodiment

In Embodiment 1, undoped polysilicon film 5A is formed on the surface of silicon element substrate 3 and in trench 8 [FIG. 1(c)]. However, a polysilicon film 5B containing a dopant, such as phosphorus or boron may be formed instead. Phosphorus may be added by including phosphine ($PH_3$) in the monosilane gas ($SiH_4$) used in the low-pressure CVD. Alternatively, boron may be added by including diborane ($B_2H_6$) in the monosilane gas. The remaining steps are the same as described in Embodiment 1.

As in Embodiment 1, by oxidizing polysilicon film 5B to form a second oxidized film 6B that fills trench 8, stress can be relieved during the formation of an insulating film in trench 8. This prevents degradation of the crystals in silicon element substrate 3. Furthermore, since during the oxidization of polysilicon film 5B dopant contained in polysilicon film 5B diffuses into silicon element substrate 3, a diffusion area is formed in silicon element substrate 3 near trench 8 that prevents extension of a depletion layer. Polysilicon film 5B also has a gettering function that prevents contamination of silicon element substrate 3 with iron, thereby improving the performance characteristics and reliability of the semiconductor element.

Third Embodiment

Figure 2A:
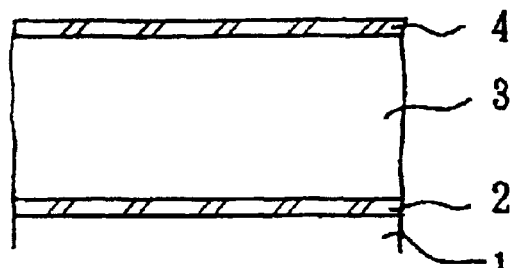
FIG. 2(a) is a cross-sectional view of the formation of a first oxidized insulating film on a silicon element substrate according to the third embodiment of the invention.
Figure 2B:
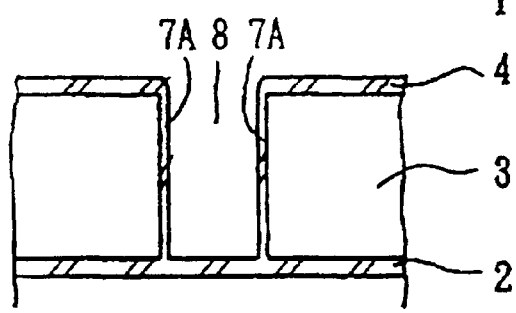
FIG. 2(b) is a cross-sectional view of the formation of a third insulating film on the silicon substrate element and the walls of an element-separating trench according to the third embodiment of the invention.

As in the first embodiment, the SOI wafer has a silicon element substrate 3 formed on an separating insulating film 2. Separating insulating film 2 is formed on a support substrate 1. Thermal oxidization is performed to form a first oxidized insulating film 4 on an SOI wafer [FIG. 2(a)]. First oxidized insulating film 4 is etched by photo-etching-based patterning and etching to produce an oxidized film mask. Anisotropic etching is then performed by any convenient means, such as magnetron reaction ion etching (RIE) using hydrogen bromide (HBr) as the etching gas, to anisotropically etch silicon element substrate 3 and form an element-separating trench 8. Thermal oxidation is then performed to form a third insulating film 7A, having a thickness of about 0.1 µm, on the side wall of element-separating trench 8 [FIG. 2(b)].

Figure 2C:
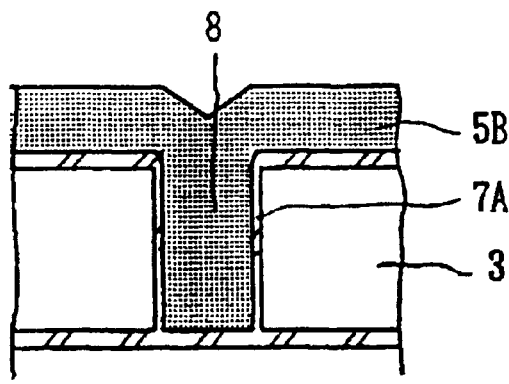
FIG. 2(c) is a cross-sectional view of the formation of a polysilicon film on the surface of a silicon element substrate and in an element-separating trench according to the third embodiment of the invention.
Figure 2D:
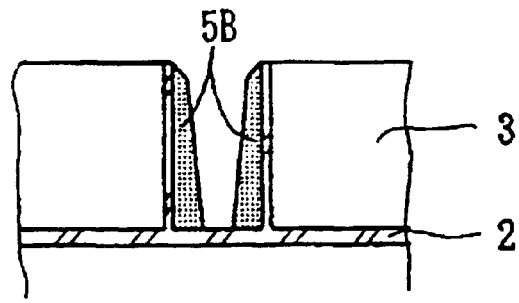
FIG. 2(d) is a cross-sectional view of the polysilicon film left on the side walls of a trench after anisotropic etching according to the third embodiment of the invention.
Figure 2E:
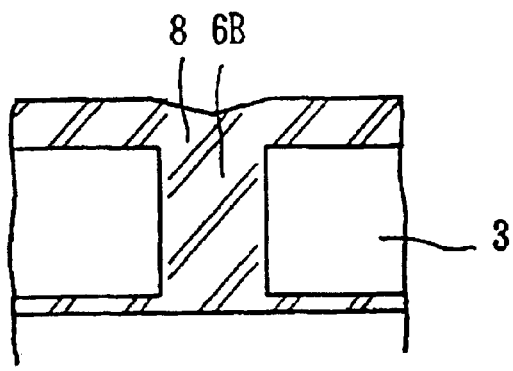
FIG. 2(e) is a cross-sectional view of the formation of a second oxidized film that buries a trench according to the third embodiment of the invention.

Next, low-pressure CVD is executed, using a monosilane gas that may include phosphine ($PH_3$) or diborane ($B_2H_6$), to form polysilicon film 5B on silicon element substrate 3 and in trench 8 [FIG. 2(c)]. Anisotropic etching with HBr is again employed to etch polysilicon film 5B on the surface of silicon element substrate 3 and in trench 8. Polysilicon film 5B is etched so that polysilicon film 5B remains on the side wall of trench 8 and separating insulating film 2 is exposed at the bottom of trench 8. A fluorine solution is then used to remove first oxidized insulating film 4 from the surface of silicon element substrate 3 [FIG. 2(d)]. Finally, polysilicon film 5B remaining on the side wall of trench 8 is thermally oxidized to fill trench 8 and form a second oxidized film 6B on the surface of silicon element substrate 3 [FIG. 2(e)].

Figure 6A:
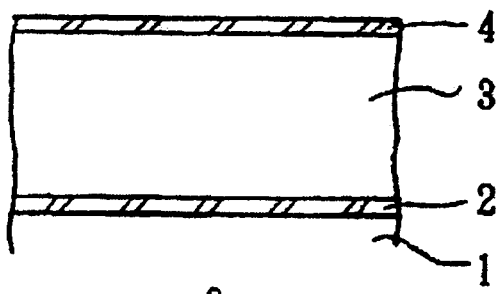
FIG. 6(a) is a cross-sectional view of the formation of an oxidized film on a silicon element substrate according to the prior art.
Figure 6B:
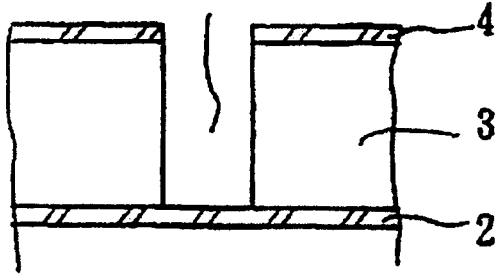
FIG. 6(b) is a cross-sectional view of the formation of a trench in a silicon element substrate according to the prior art.
Figure 6C:
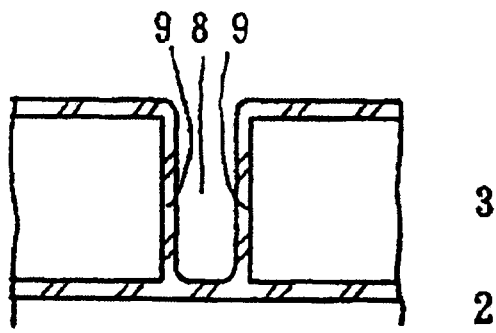
FIG. 6(c) is a cross-sectional view of the formation of an oxidized-film layer on a silicon element substrate and the walls of a trench according to the prior art.
Figure 6D:
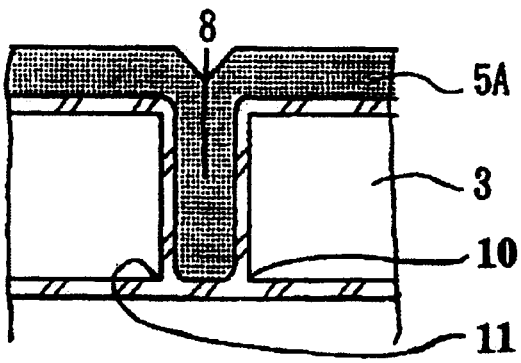
FIG. 6(d) is a cross-sectional view of the deposition of a polysilicon film on a semiconductor element substrate and in a trench according to the prior art.
Figure 6E:
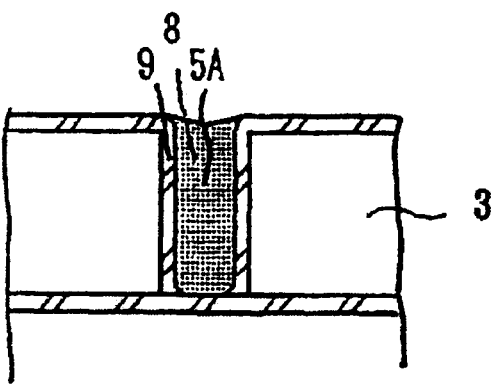
FIG. 6(e) is a cross-sectional view of the removal of a polysilicon film layer from a semiconductor element substrate according to the prior art.

By oxidizing polysilicon film 5B left on the side wall of trench 8 to form second oxidized film 6B that fills trench 8, stress can be relieved during the formation of second oxidized film 6B. This prevents the degradation of crystals of silicon element substrate 3. In addition, third insulating film 7A is thinner than oxidized film 9 of the prior art method, which must be about 0.5–1.0 µm in order to act as an insulator [FIG. 6(c)]. Therefore, formation of third insulating film 7A requires less time and a lower temperature than formation of oxidized film 9 in the prior art methods. Furthermore, the gettering function of polysilicon film 5B prevents contamination of silicon element substrate 3 with iron, and improves the characteristics and reliability of the semiconductor element.

While third oxidized film 7A does not further restrain the diffusion of impurities such as iron, it does inhibit the diffusion of phosphorus or boron dopant from polysilicon film 5B into silicon element substrate 3. Therefore, the device formed within silicon element substrate 3 can be shielded from the dopant, which may otherwise adversely affect performance or reliability of the device.

Fourth Embodiment

Figure 3A:
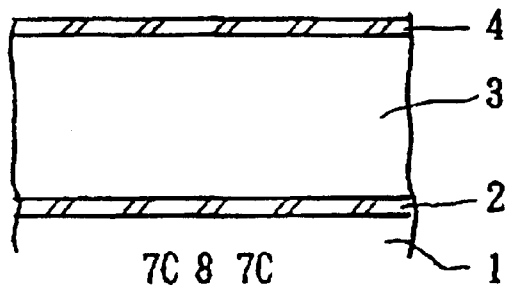
FIG. 3(a) is a cross-sectional view of the formation of a first oxidized insulating film on a silicon element substrate according to the fourth embodiment of the invention.
Figure 3B:
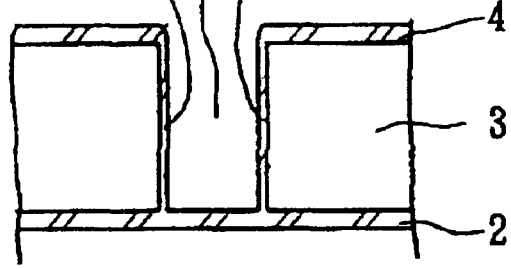
FIG. 3(b) is a cross-sectional view of the formation of a third insulating film on the silicon element substrate and the walls of an element-separating trench according to the fourth embodiment of the invention.

As in the first embodiment, the SOI wafer has a silicon element substrate 3 formed on an separating insulating film 2. Separating insulating film 2 is formed on a support substrate 1. Thermal oxidization is performed to form a first oxidized insulating film 4 on an SOI wafer [FIG. 3(a)]. First oxidized insulating film 4 is etched by photo-etching-based patterning and etching to produce an oxidized film mask. Anisotropic etching is then performed by any convenient means, such as magnetron reaction ion etching (RIE) using hydrogen bromide (HBr) as the etching gas, to anisotropically etch silicon element substrate 3 and form an element-separating trench 8. Low-pressure CVD is performed, using a monosilane gas, to form a pure, thin polysilicon film on silicon element substrate 3 and in trench 8. The thin polysilicon film is then oxidized to obtain a third oxidized film 7C [FIG. 3(b)].

Figure 3C:
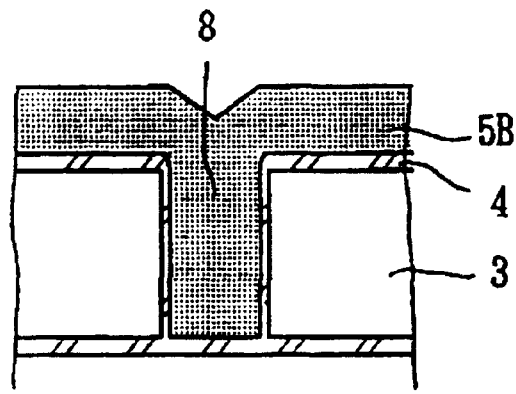
FIG. 3(c) is a cross-sectional view of the formation of a polysilicon film on the surface of a silicon element substrate and in an element-separating trench according to the fourth embodiment of the invention.
Figure 3D:
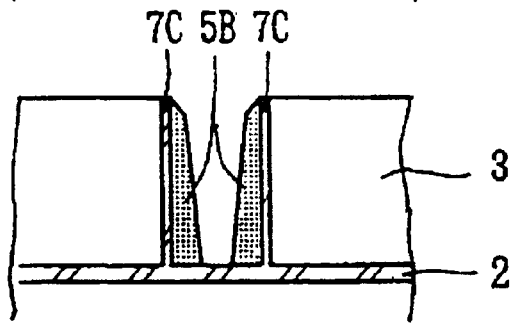
FIG. 3(d) is a cross-sectional view of the polysilicon film left on the side walls of a trench after anisotropic etching according to the fourth embodiment of the invention.
Figure 3E:
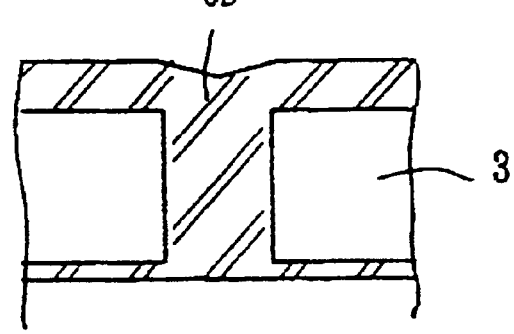
FIG. 3(e) is a cross-sectional view of the formation of a second oxidized film that buries a trench according to the fourth embodiment of the invention.

Next, low-pressure CVD is performed, using a monosilane gas that may include phosphine ($PH_3$) or diborane ($B_2H_6$), to form a polysilicon film 5B on silicon element substrate 3 and in trench 8 [FIG. 3(c)]. Anisotropic etching is again used to etch polysilicon film 5B on the surface of silicon element substrate 3 and in trench 8. Polysilicon film 5B is etched so that polysilicon film 5B remains on the side wall of trench 8 and separating insulating film 2 is exposed at the bottom of trench 8. A fluorine solution is then used to remove first oxidized insulating film 4 from the surface of silicon element substrate 3 [FIG. 3(d)]. Finally, polysilicon film 5B remaining on the side wall of trench 8 is thermally oxidized to fill trench 8 and form a second oxidized film 6B on the surface of silicon element substrate 3 [FIG. 3(e)].

By oxidizing the polysilicon film 5B left on the side wall of trench 8 to form second oxidized film 6B that fills trench 8 as in Embodiment 3, stress can be relieved during the formation of an insulating film in trench 8. This prevents degradation of silicon crystals in silicon element substrate 3. Furthermore, the gettering function of polysilicon film 5B prevents contamination of silicon element substrate 3 with iron and improves the characteristics and reliability of the semiconductor element.

In this embodiment, third oxidized film 7C is formed by thermal oxidation of a polysilicon film deposited by low pressure CVD. In Embodiment 3, third oxidized film 7A is formed by thermal oxidation of silicon element substrate 3. A polysilicon film, such as third oxidized film 7C, oxidizes faster than the monocrystal silicon of silicon element substrate 3, which generates third oxidized film 7A; therefore, the oxidization temperature and time of Embodiment 4 are reduced as compared to Embodiment 3, and still further as compared to the prior art methods. This further prevents formation of defective crystals in silicon element substrate 3.

Fifth Embodiment

Figure 4A:
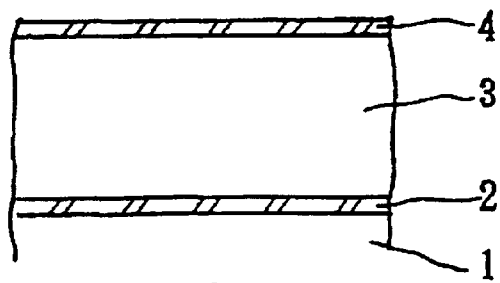
FIG. 4(a) is a cross-sectional view of the formation of a first oxidized insulating film on a silicon element substrate according to the fifth embodiment of the invention.
Figure 4B:
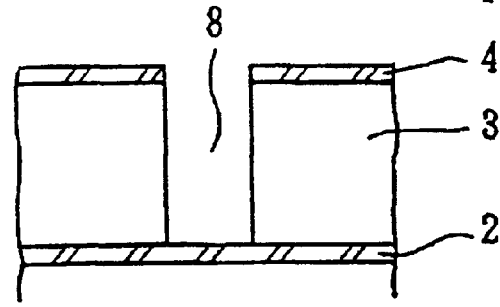
FIG. 4(b) is a cross-sectional view of the formation of an element-separating trench according to the fifth embodiment of the invention.

As in the first embodiment, the SOI wafer has a silicon element substrate 3 formed on an separating insulating film 2. Separating insulating film 2 is formed on a support substrate 1. Thermal oxidization is performed to form a first oxidized insulating film 4 on an SOI wafer [FIG. 4(a)]. First oxidized insulating film 4 is etched by photo-etching-based patterning and etching to produce an oxidized film mask. Anisotropic etching is then performed by any convenient means, such as magnetron reaction ion etching (RIE) using hydrogen bromide (HBr) as the etching gas, to anisotropically etch silicon element substrate 3 and form an element-separating trench 8 that reaches separating insulating film 2 [FIG. 2(b)].

Figure 4C:
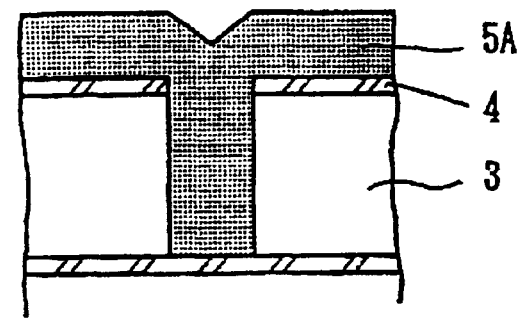
FIG. 4(c) is a cross-sectional view of the formation of a polysilicon film on the surface of a silicon element substrate and in an element-separating trench according to the fifth embodiment of the invention.
Figure 4D:
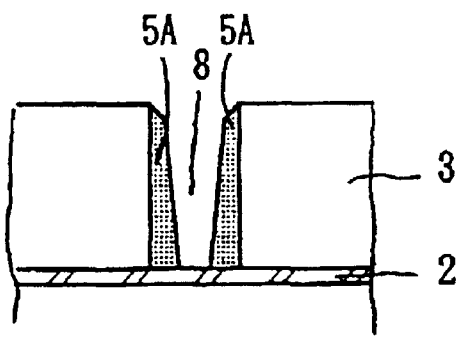
FIG. 4(d) is a cross-sectional view of the polysilicon film left on the side walls of a trench after anisotropic etching according to the fifth embodiment of the invention.

Next, low-pressure CVD is performed, for example using a monosilane gas that may include phosphine ($PH_3$) or diborane ($B_2H_6$), at a reaction temperature of about 600° C., to form a polysilicon film 5A on the surface of silicon element substrate 3 and in trench 8 [FIG. 4(c)]. Following the formation of polysilicon film 5A, anisotropic etching with HBr is again used to etch polysilicon film 5A on the surface of silicon element substrate 3 and in trench 8. In this case, polysilicon film 5A is etched so that a larger amount of the film remains on the side wall of the trench 8 than in Embodiment 1, while still exposing separating insulating film 2 at the bottom of trench 8. This adjustment can be made by controlling the gas pressure and the bias voltage during RIE. A fluorine solution is subsequently used to remove first insulating film 4 from the surface of silicon element substrate 3 [FIG. 4(d)].

Figure 4E:
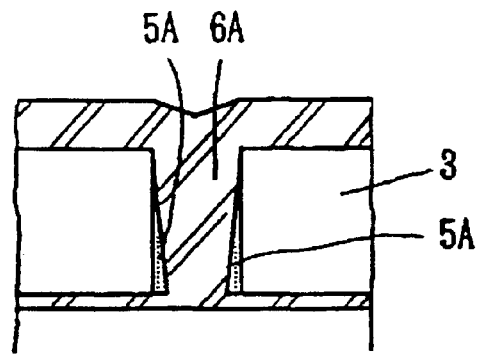
FIG. 4(e) is a cross-sectional view of the formation of a second oxidized film that buries a trench according to the fifth embodiment of the invention.

Polysilicon film 5A remaining on the side wall of trench 8 is thermally oxidized to fill trench 8 and form a second oxidized film 6A on the surface of silicon element substrate 3. In this case, since the amount of polysilicon film 5A on the side wall is greater than in Embodiment 1, part of unoxidized polysilicon film 5A still remains thereon, even after trench 8 has been filled by oxidation [FIG. 4(e)]. Therefore, stress can further be alleviated during the formation of an insulating film in trench 8, because second oxidized film 6A is separated from silicon element substrate 3 by the unoxidized portion of polysilicon film 5A. The effect is similar to the generation of third insulating film 7C in Embodiment 3 (see FIG. 3(d)), which also acts to separate second oxidized film 6B from silicon element substrate 3 (see FIGS. 3(d)–3(e)).

Sixth Embodiment

Figure 5A:
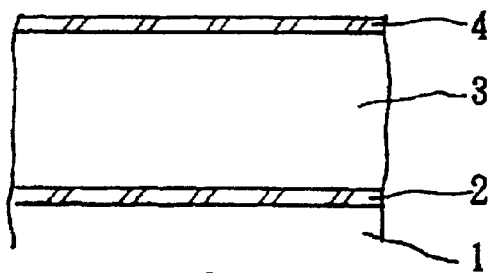
FIG. 5(a) is a cross-sectional view of the formation of a first oxidized insulating film on a silicon element substrate according to the sixth embodiment of the invention.
Figure 5B:
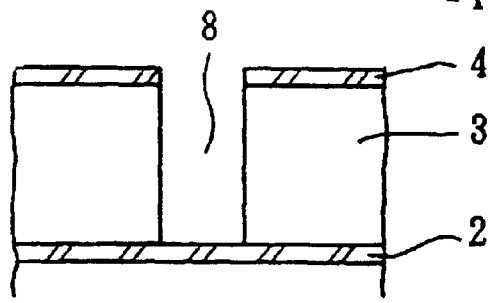
FIG. 5(b) is a cross-sectional view of the formation of an element-separating trench according to the sixth embodiment of the invention.

As in the first embodiment, the SOI wafer has a silicon element substrate 3 formed on an separating insulating film 2. Separating insulating film 2 is formed on a support substrate 1. Thermal oxidation is performed to form a first oxidized insulating film 4 on an SOI wafer [FIG. 5(a)]. First oxidized insulating film 4 is etched by photo-etching-based patterning and etching to produce an oxidized film mask. Anisotropic etching is then performed by any convenient means, such as magnetron reaction ion etching (RIE) using hydrogen bromide (HBr) as the etching gas, to anisotropically etch silicon element substrate 3 and form an element-separating trench 8 that reaches separating insulating film 2 [FIG. 5(b)].

Figure 5C:
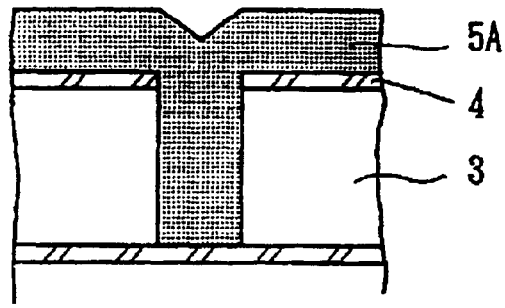
FIG. 5(c) is a cross-sectional view of the formation of a polysilicon film on the surface of a silicon element substrate and in an element-separating trench according to the sixth embodiment of the invention.

Next, low-pressure CVD is performed, for example using a monosilane gas that may include phosphine ($PH_3$) or diborane ($B_2H_6$), at a reaction temperature of about 600° C., to form a polysilicon film 5A on the surface of silicon element substrate 3 and in trench 8 [FIG. 5(c)]. Anisotropic etching is again used to etch polysilicon film 5A on the surface of silicon element substrate 3 and in trench 8. Polysilicon film 5A is etched so that polysilicon film 5A remains on the side wall of trench 8 and separating insulating film 2 is exposed at the bottom of trench 8. A fluorine solution is then used to remove first oxidized insulating film 4 from the surface of silicon element substrate 3 [FIG. 5(d)].

Figure 5D:
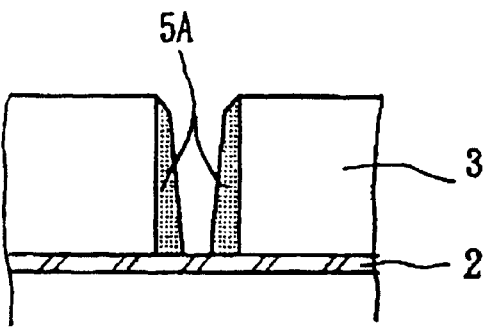
FIG. 5(d) is a cross-sectional view of the polysilicon film left on the side walls of a trench after anisotropic etching according to the sixth embodiment of the invention.
Figure 5E:
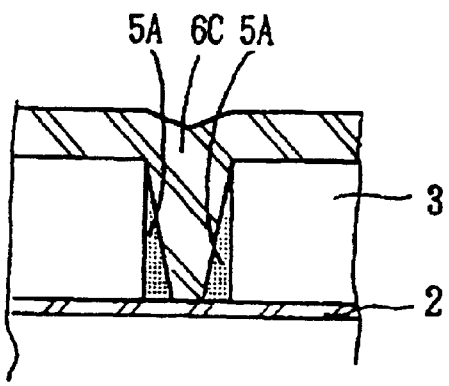
FIG. 5(e) is a cross-sectional view of the formation of a second oxidized film that buries a trench according to the sixth embodiment of the invention.

Following the anisotropic etching of first polysilicon film 5A in FIG. 5(d), low-pressure CVD is performed at a reaction temperature of 750° C., using for example monosilane ($SiH_4$) and nitrous oxide ($N_2O$) as the material gases. A CVD-generated second oxidized film 6C is thereby formed, which buries trench 8 while being deposited on the surface of silicon-element substrate 3 [FIG. 5(e)].

Low-pressure CVD requires lower temperatures than thermal oxidation, so the formation of CVD-generated second oxidized film 6C creates less stress on silicon element substrate 3 than the embodiments that rely on thermal oxidation to generate the second oxidized films. This prevents degradation of the crystals in silicon element substrate 3, and improves the performance characteristics and reliability of the semiconductor element.

It would be apparent to one skilled in the art that this invention is not limited to a lamination SOI substrate, in which a support substrate and a silicon element substrate are laminated via an insulating film. For example, the present invention would also be applicable to a Separation by Implanted Oxygen (SIMOX) substrate, in which a high concentration of ions are implanted into a silicon element substrate to separate a dielectric by forming an oxidized film in the silicon element.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor device manufacturing method, comprising the steps of:

forming a first insulating film on a silicon element substrate in an SOI substrate by thermal oxidation of said silicon element substrate, wherein said SOI substrate includes a support substrate, said silicon element substrate, and a separating insulating film between said silicon element substrate and said support substrate;

etching said silicon element substrate to form a trench, said trench having a bottom formed by a portion of said separating insulating film, and at least one side wall formed by at least one portion of said silicon element substrate;

depositing a first polysilicon film upon a surface of said bottom, a surface of each of said at least one side wall of said trench, and said first insulating film;

etching said first polysilicon film on said insulating film and on said bottom of said trench, using an anisotropic etching technique, to expose said first insulating film and a portion of said bottom, and to leave a portion of said polysilicon on said at least one side wall of said trench;

etching and removing said exposed first insulating film; and depositing an oxidized insulating film on said silicon element substrate and in said trench, using chemical vapor deposition, to isolate said silicon element substrate.

2. The semiconductor device manufacturing method according to claim 1, wherein said first polysilicon film contains a dopant.

* * * * *